(12) United States Patent
Iwatani et al.

(10) Patent No.: US 6,781,350 B1
(45) Date of Patent: Aug. 24, 2004

(54) AUTOMOTIVE DYNAMO CONTROLLER

(75) Inventors: Shiro Iwatani, Tokyo (JP); Hirofumi Watanabe, Tokyo (JP); Tatsuki Kouwa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/831,040

(22) PCT Filed: Sep. 10, 1999

(86) PCT No.: PCT/JP99/04950

§ 371 (c)(1),
(2), (4) Date: Aug. 7, 2001

(87) PCT Pub. No.: WO01/20769

PCT Pub. Date: Mar. 22, 2001

(51) Int. Cl.[7] .............................. H02P 9/14; H02P 9/30; H02J 7/14
(52) U.S. Cl. ............................... 322/27; 322/17; 322/28
(58) Field of Search ..................................... 322/17, 27

(56) References Cited

U.S. PATENT DOCUMENTS

| | | | |
|---|---|---|---|
| 3,876,926 A | | 4/1975 | Schott et al. ................... 322/28 |
| 4,128,801 A | | 12/1978 | Gansert et al. ................ 322/28 |
| 4,310,792 A | | 1/1982 | Iwatani et al. ................. 322/28 |
| 4,336,487 A | * | 6/1982 | Tanaka et al. ................ 322/99 |
| 4,349,854 A | * | 9/1982 | Mori et al. ..................... 361/21 |
| 4,651,081 A | * | 3/1987 | Nishimura et al. ........... 320/64 |
| 4,680,529 A | * | 7/1987 | Komurasaki et al. ......... 322/28 |
| 4,686,446 A | * | 8/1987 | Nishimura et al. ........... 322/33 |
| 4,739,243 A | | 4/1988 | Iwatani et al. ................. 322/10 |
| 4,831,322 A | * | 5/1989 | Mashino et al. .............. 322/28 |
| 4,839,576 A | * | 6/1989 | Kaneyuki et al. ............. 322/25 |
| 5,140,253 A | * | 8/1992 | Itoh .............................. 322/28 |
| 5,144,220 A | * | 9/1992 | Iwatani et al. ................ 322/28 |
| 5,198,744 A | * | 3/1993 | Kohl et al. ................... 322/33 |
| 5,262,711 A | * | 11/1993 | Mori et al. .................... 322/28 |
| 5,378,313 A | * | 1/1995 | Pace ............................ 216/20 |
| 5,455,463 A | * | 10/1995 | Langnickel et al. ....... 307/10.1 |
| 5,481,176 A | * | 1/1996 | DeBiasi et al. ................ 322/7 |
| 5,491,400 A | * | 2/1996 | Iwatani et al. ................ 322/28 |
| 5,497,071 A | * | 3/1996 | Iwatani et al. ................ 322/28 |
| 5,561,363 A | * | 10/1996 | Mashino et al. ............. 322/25 |

(List continued on next page.)

FOREIGN PATENT DOCUMENTS

| | | | | |
|---|---|---|---|---|
| EP | 1130766 A1 | * | 9/2001 | ............. H02P/9/30 |
| GB | 2 000 648 A | | 1/1979 | |
| JP | 5-198402 | | 8/1993 | |
| JP | 00661791 A2 | * | 7/1995 | ............. H02J/7/14 |
| JP | 07222376 A | * | 8/1995 | ............. H02J/7/24 |
| JP | 9-149693 | | 6/1997 | |
| JP | 10-136697 | | 8/1999 | |
| WO | WO 01/20769 A1 | * | 3/2001 | |
| WO | WO 200120769 A1 | * | 3/2001 | ............. H02J/7/18 |

*Primary Examiner*—Thomas M. Dougherty
*Assistant Examiner*—Pedro J Cuevas
(74) *Attorney, Agent, or Firm*—Sughrue Mion, PLLC

(57) ABSTRACT

A controller for an A.C. generator for a vehicle, includes: batteries each of which is charged with electric charges on the basis of an output of generation of electrical energy of an A.C. generator having a field coil; voltage regulating means for regulating a current, which is caused to flow through the field coil, on the basis of the detection result of a voltage developed across the terminals the batteries due to an output voltage of the A.C. generator into an fixed output value of the generation of electrical energy of the A.C. generator; and field current restricting means for detecting a current which is caused to flow through the field coil by means of a field current detecting resistor to restrict the current to a predetermined value in correspondence with the detection result, wherein the field current detecting resistor is formed as a thick film printed resistor, and wherein each of the means other than the thick film printed resistor is formed by an electronic circuit are in the form of an integrated circuit.

4 Claims, 3 Drawing Sheets

U.S. PATENT DOCUMENTS

| | | | | |
|---|---|---|---|---|
| 5,581,172 A | * | 12/1996 | Iwatani et al. | 322/28 |
| 5,629,606 A | * | 5/1997 | Asada | 322/28 |
| 5,646,599 A | | 7/1997 | Adachi | 430/648 |
| 5,754,030 A | * | 5/1998 | Maehara et al. | 322/19 |
| 5,859,581 A | * | 1/1999 | Morris | 338/50 |
| 5,874,889 A | * | 2/1999 | Higdon et al. | 340/426 |
| 5,880,577 A | * | 3/1999 | Aoyama et al. | 322/29 |
| 5,886,500 A | * | 3/1999 | Iwatani et al. | 320/104 |
| 5,966,159 A | * | 10/1999 | Ogasawara | 347/133 |
| 5,970,398 A | * | 10/1999 | Tuttle | 455/193.1 |
| 5,982,155 A | * | 11/1999 | Rechdan et al. | 322/36 |
| 6,005,372 A | * | 12/1999 | Kouwa et al. | 322/25 |
| 6,121,757 A | * | 9/2000 | Takahashi et al. | 322/28 |
| 6,122,494 A | * | 9/2000 | Tuttle | 455/193.1 |
| 6,394,206 B1 | * | 5/2002 | Fury | 180/53.4 |
| 6,411,065 B1 | * | 6/2002 | Underwood et al. | 322/20 |
| 6,429,627 B1 | * | 8/2002 | Koss et al. | 322/27 |
| 6,462,516 B1 | * | 10/2002 | Watanabe | 322/28 |
| 6,574,454 B1 | * | 6/2003 | Tuttle | 455/41.1 |
| 6,600,428 B1 | * | 7/2003 | O'Toole et al. | 340/825.36 |

* cited by examiner

US 6,781,350 B1

AUTOMOTIVE DYNAMO CONTROLLER

TECHNICAL FIELD

The present invention relates to an electronic control circuit for controlling generator output, which is accommodated in a vehicle-mounted A.C. generator, and is in the form of a monolithic IC chip on a ceramic substrate.

BACKGROUND ART

Heretofore, as a controller, for an A.C. generator in a vehicle in which discrete components are employed as circuit elements to be mounted onto a wiring board, a controller is known which has a circuit configuration shown in FIG. 3. This controller includes: an A.C. generator 1 having an armature coil 101 for driving an engine and for starting the generating operation of electrical energy, and a field coil 102; a rectifier 2 for taking out an output of generating electrical energy from the armature coil 101 to rectify the output, which is supplied to batteries 4 or to an electrical load (not shown); and a controller 3 having a voltage regulator 3a for detecting the voltage developed across the terminals of the batteries 4 to adjust the output voltage of the A.C. generator 1 on the basis of the voltage thus detected and a field current restricting unit 3b for detecting the field current caused to flow through the field coil 102 to restrict the field current on the basis of the detected current.

Reference numeral 5 indicates a key switch for starting the engine. This key switch 5 is turned ON so that the current flows through the field coil 102 from the batteries 4 to carry out the initial excitation.

The voltage regulator 3a is configured in such a way as to include: a constant voltage circuit in which an operating resistor 301 and a Zener diode 302 are electrically connected in series between the positive electrode of the batteries 4 and the earth through the key switch 5 to fetch a constant voltage A, which is determined on the basis of the breakdown voltage of the Zener diode 302, from a connection point P between the operating resistor 301 and the Zener diode 302; a voltage dividing circuit having voltage dividing resistors 303 and 304, which are electrically connected in series between an output terminal 201 of a positive electrode and an output terminal 202 of a negative electrode of the rectifier 2 to divide the output voltage of the rectifier 2; a first comparator 307 for applying a divided voltage Vd from the voltage dividing circuit to an input terminal (−) of the negative side and for applying a fixed reference voltage $V_{REF1}$ to an input terminal (+) of the positive side to make H or L the logical level at the output terminal in accordance with the magnitude relationship between the divided voltage Vd and the reference voltage $V_{REF1}$; an output transistor 311 which is turned ON at the time when the logical level at the output terminal of the first comparator 307 has become H to cause the field current to flow through the field coil 102 from the batteries 4; a suppression diode 310 which is electrically connected in reverse between a positive side line and a collector of the output transistor 311 to suppress a surge current which occurs at the time when shutting off the field current; and a base resistor 309 which is electrically connected between the output side of the key switch 5 and the base of the output transistor 311 to restrict a base current which is caused to flow through the base of the output transistor 311 at the time when carrying out the initial excitation of the field coil 102.

The field current restricting unit 3b includes: a voltage dividing circuit having voltage dividing resistors 305 and 306 for dividing a constant voltage A at a predetermined resistance ratio to generate a predetermined reference voltage $V_{REF2}$; a field current detecting resistor 312 connected between an emitter of the output transistor 311 and the earth for converting the field current flowing through the emitter into a voltage V1 to detect the voltage V1 thus obtained; and a second comparator 308 for applying the reference voltage $V_{REF2}$ to an input terminal (+) of the positive side and for applying the voltage V1 to an input terminal (−) of the negative side to make L the logical level at the output terminal at the time when the voltage V1 has become higher than the reference voltage $V_{REF2}$.

Now, the description hereinbelow will be given with respect to the outline of the operation in the conventional controller for an A.C. generator for a vehicle.

After having started the engine, the divided voltage Vd as a criterion of the terminal voltage of the batteries 4 rises above the reference voltage $V_{REF1}$ to provide the overcharging state, the logical level at the output terminal of the first comparator 307 goes to L to turn OFF the output transistor 311 so that the field current to the field coil 102 is shut off, which reduces the output of the electrical energy generation.

When the terminal voltage of the batteries 4 has been reduced and also the divided voltage Vd has become lower than the reference voltage $V_{REF1}$, the logical level at the output terminal of the first comparator 307 goes to H to turn ON the output transistor 311. As a result, the current flowing loop consisting of the batteries 4, the field coil 102, the output transistor 311, the field current detecting resistor 312, and the earth is formed so that the field current is caused to flow from the batteries 4 to the field coil 102 to carry out the generation of electrical energy, and also the output of the generation of electrical energy is rectified through the rectifier 2 to be supplied to the batteries 4 which are in turn charged with the fixed voltage 14.5 V for example.

In this way, the output transistor 311 is turned repeatedly ON/OFF in accordance with the drop and the rise of the voltage developed across the terminals of the batteries 4 to intermittently control the field current to so that the terminal voltage is maintained at a fixed value.

The surge current which is generated through the field coil 102 along with the interruption of the field current is suppressed by the suppression diode 310 to mitigate the influence thereof exerted on the electronic circuit.

However, if the line through which the terminal voltage of the batteries 4 is detected is cut in the voltage regulator 3a so that the divided voltage Vd becomes zero, for example, then the logical level of the output of the first comparator 307 continues to be H, and hence the A.C. generator 1 starts to cause to flow the excessive field current through the output transistor 311 in order to make the divided voltage Vd the reference voltage $V_{REF1}$.

At this time, the field current is caused to flow through the field current detecting resistor 312 to generate the voltage drop of the voltage V1. Then, the voltage V1 is applied to the negative side input terminal (−) of the second comparator 308. The reference voltage $V_{REF2}$ which is used to judge the excessive field current is applied to the positive side input terminal (+) of the second comparator 308. At the time when the voltage V1 has become higher than the reference voltage $V_{REF2}$, the logical level at the output terminal of the second comparator 308 goes to L.

For this reason, the output at the logical level H of the first comparator 307 is absorbed by the output terminal of the second comparator 308, whereby the base current of the output transistor 311 is shut off, and the field current is also shut off to stop the generation of electrical energy to prevent the burning of the A.C. generator.

If the discrete components such as resistors, capacitors and semiconductor devices are mounted onto the printed board as in the method of mounting the electronic apparatus in the conventional controller, then a large mounting area is required and the scale of the whole controller becomes large.

In addition thereto, since the high accuracy is required for the output control of the vehicle A.C. generator along with the promotion of the electronics for the vehicle control, the complexity and the high density of the electronic circuit in the controller are unavoidable.

Therefore, in the case where the discrete components are mounted to the printed board to configure such an electronic circuit, there arises the inconvenience that the scale of the whole controller becomes so large as to restrict the miniaturization of the A.C. generator.

In the light of the foregoing, the present invention has been made in order to solve the above-mentioned problems associated with the prior art, and hence it is therefore an object of the present invention to obtain a controller for an A.C. generator in which the circuit board can be miniaturized and the difficulty of building the circuit board into the body of the A.C. generator is removed, and also a constant of a field current detecting resistance can be readily changed in correspondence with the field current of the A.C. generator.

DISCLOSURE OF THE INVENTION

1. The present invention includes: batteries each of which is charged with electric charges on the basis of an output of generation of electrical energy of an A.C. generator having a field coil; voltage regulating means for regulating a current, which is caused to flow through the field coil, on the basis of the detection result of a voltage developed across the terminals of the batteries due to an output voltage of the A.C. generator into an fixed output value of generation of electrical energy of the A.C. generator; and field current restricting means for detecting a current flowing through the field coil by means of a field current detecting resistor, which restricts the current to a predetermined value in correspondence to the detection result, wherein the field current detecting resistor is formed in the form of a thick film printed resistor, and with respect to each of the means other than the thick film printed resistor, electronic circuits are configured in the form of an integrated circuit.

2. According to the present invention, the thick film printed resistor and the integrated circuits are formed on an insulating board.

3. According to the present invention, a resistor body constituting the thick film printed resistor is trimmed to adjust the resistance value thereof and to adjust the field current detection value.

4. According to the present invention, failure alarm means for detecting a failure of the A.C. generator on the basis of the output of the A.C. generator to give an alarm is provided in the form of an integrated circuit.

BEST MODE FOR CARRYING OUT THE INVENTION

Embodiment 1

The high accuracy is required for the output control of an A.C. generator for a vehicle along with the promotion of the electronics of the vehicle control. In response to this requirement, the complexity of the electronic circuits in a controller, and the high density of the circuit configuration in a substrate (board) resulting therefrom are unavoidable.

Figure 1:
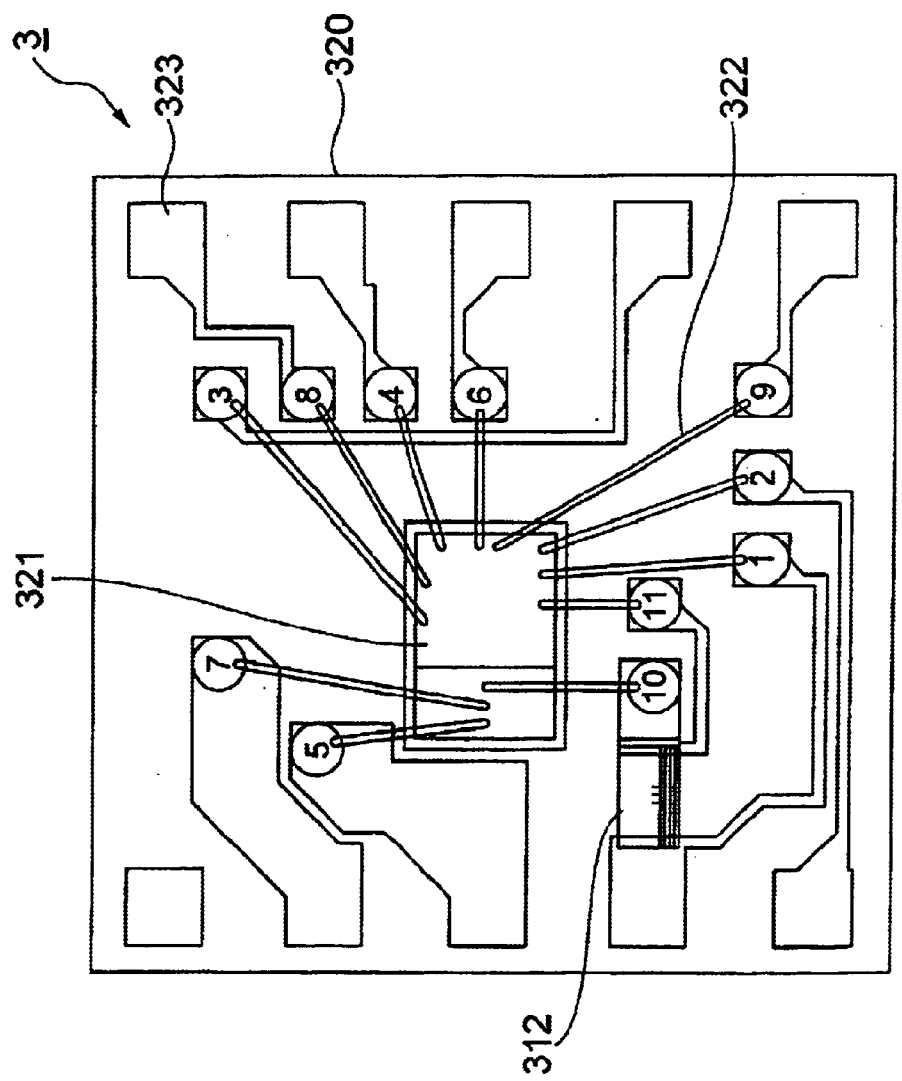
FIG. 1 is a diagram showing the construction when a control unit in a controller of an A.C. generator for a vehicle according to an embodiment 1 of the present invention is configured in the form of an integrated circuit.

Now, in the present embodiment, as shown in FIG. 1, the respective electronic circuits, except for a field current detecting resistor 312, i.e., a voltage regulator 3*a* and a field current restricting unit 3*b* are integrated in the form of a monolithic IC chip 321 on a ceramic substrate 320 having a high heat radiating effect. In the ceramic substrate 320, signal I/O terminals 323 are formed through the patterning in the periphery of the monolithic IC chip 321. The signal I/O terminals 323 are electrically connected to the associated electrodes of the monolithic IC chip 321 through bonding wires 322, respectively.

Now, the field current detecting resistor 312 through which the high current is caused to flow and for which the high accurate resistance value is required is constituted by a thick film printed resistor body which is formed on the ceramic substrate utilizing the printing method.

The resistance value accuracy of the thick film printed resistor body depends on the printing accuracy for the resistor body. It is said that in the current technique, the upper limit of the resistance value accuracy is ±20%. However, the required accuracy of the resistance value is higher than value.

Therefore, in general, as the trimming method to adjust the resistance value of the thick film printed resistor body, there is adopted the method wherein the laser beam is scanned on the resistor body to vaporize and remove a part, suffering the application of the laser beam, of the thick film printed resistor body.

As another trimming method, there is the sand blasting method wherein the powder of alumina is sprayed onto the resistor body to shave off a desired amount of resistor body.

In such a way, in the present embodiment 1, the electronic circuits except for the field current detecting resistor 312 in the field current restricting unit 3*b* are formed in the form of a monolithic IC chip on the ceramic substrate 320 respectively, and the field current detecting resistor 312 is formed on the ceramic substrate 320 by utilizing the printing method.

As a result, the circuits are integrated, whereby the size of the circuit substrate is reduced. In addition, the resistance value of the field current detecting resistor 312 which is formed on the ceramic substrate 320 by utilizing the printing method, even after the resistor body has been formed on the ceramic substrate 320 by utilizing the printing method, by utilizing the above-mentioned triming method, can readily be adjusted in accordance with the specification of the field current of the A.C. generator to be used.

Embodiment 2

Figure 2:
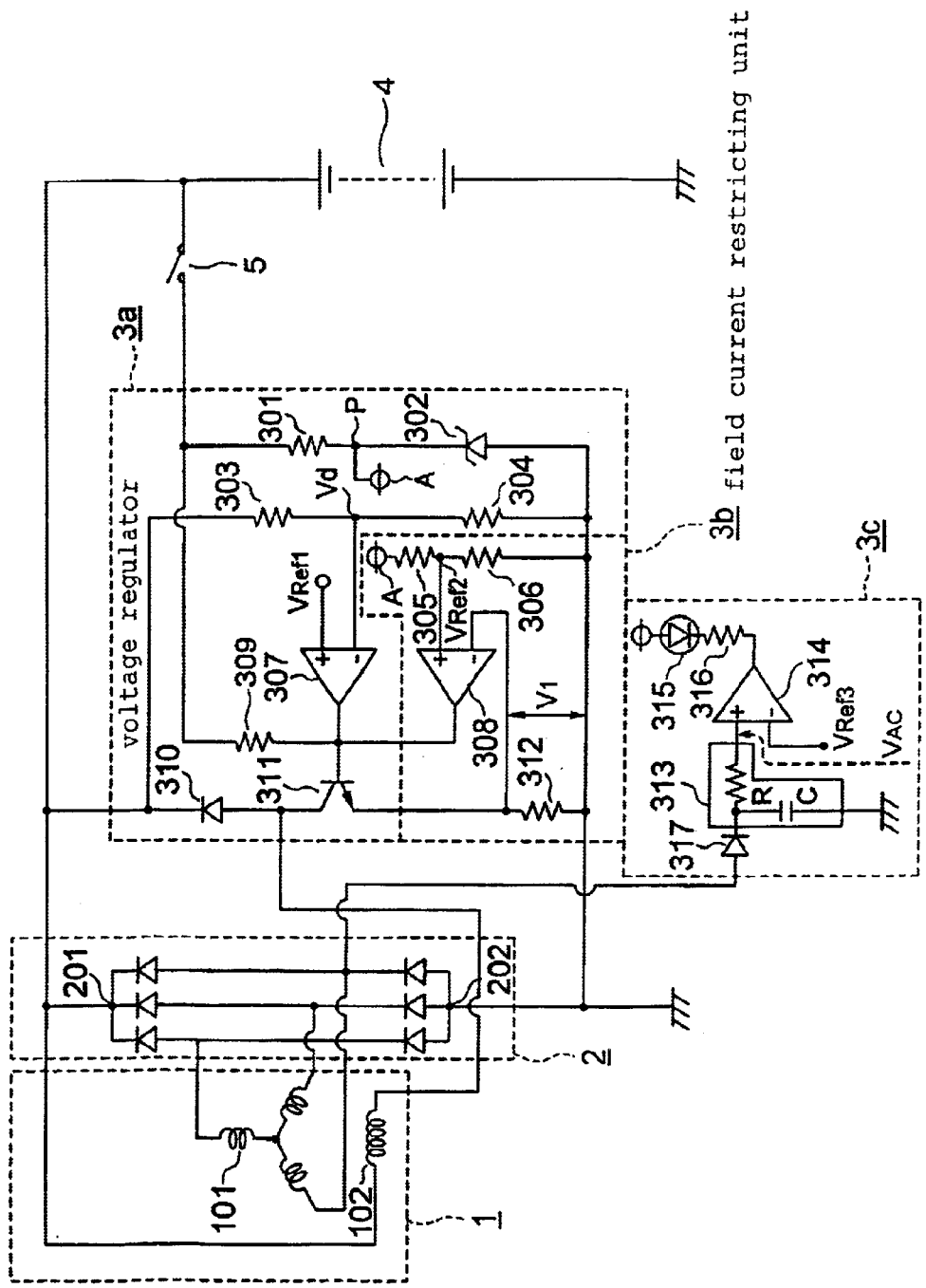
FIG. 2 is a circuit diagram showing a configuration of a controller of an A.C. generator for a vehicle according to an embodiment 2 of the present invention.
Figure 3:
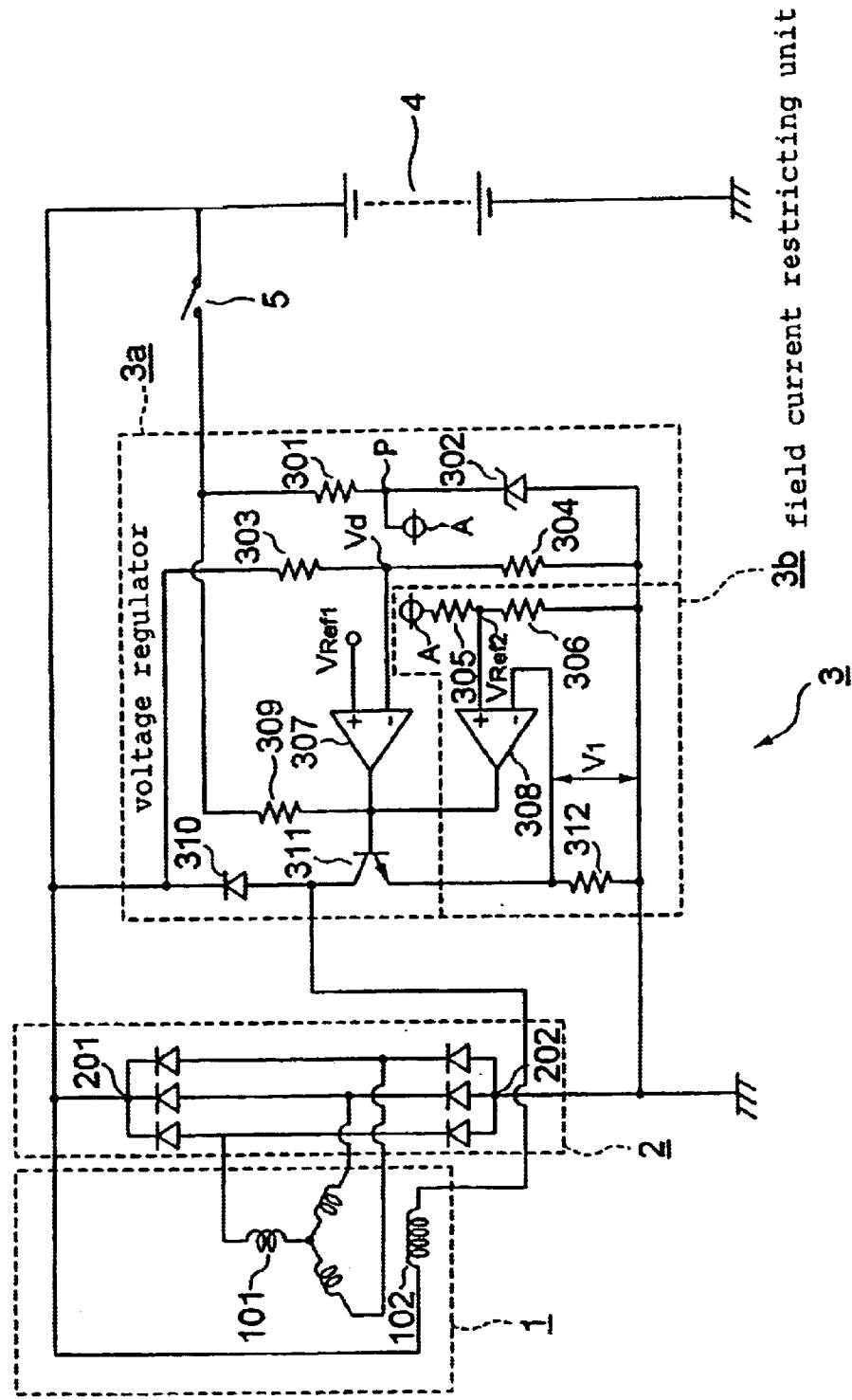
FIG. 3 is a circuit diagram showing a configuration of a controller of a conventional A.C. generator for a vehicle.

In the above-mentioned embodiment 1, the electronic circuits which constitute the voltage regulator 3*a* and the field current restricting unit 3*b* in the control unit 3 are integrated into the monolithic IC chip to be formed on the ceramic substrate 320. However, alternatively, there may also be adopted the configuration in which in addition to the electric circuit of the conventional control unit, an electronic circuit of a failure alarm 3c for giving the alarm for the failure of the A.C. generator is also integrated into the monolithic IC chip to be formed on the ceramic substrate 320, as shown in FIG. 2.

The failure alarm 3c in the present embodiment 2 includes: a diode 317 for rectifying the A.C. power generation output for one phase which has been fetched out from the armature coil 101 of the A.C. generator 1; a filter 313 for smoothing the power generation output thus rectified; a third comparator 314 for applying the smoothed power generation output (D.C. power generation output) to the positive side input terminal (+) and for applying a reference voltage $V_{REF3}$ ($V_{REF1}>V_{REF2}>V_{REF3}$), which is used to judge the reduction of the power generation output resulting from the failure of the A.C. generator 1 to the negative side input terminal (−); an LED 315 which is electrically connected in series between the terminal through which the constant voltage A is applied and the output terminal of the third comparator 314; and a current restricting resistor 316.

If, as the operation of the failure alarm 3c, some failure or other occurs in the A.C. generator 1, then the power generation outputs is reduced. After the power generation output for one phase has been fetched to be converted into the D.C. output through the diode 317 and the filter 313, it is inputted as the D.C. power generation output to the positive side input terminal (+) of the third comparator. The reference voltage $V_{REF3}$ is applied to the negative input terminal (−) of the third comparator. The third comparator 314 compares the reference voltage $V_{REF3}$ and the D.C. power generation output with each other. At a time point when the D.C. power generation output has become lower than the reference voltage $V_{REF3}$, the logical level at the output terminal goes to L. As a result, the current is caused to flow through the LED 315 and the current restricting resistor 316 by the constant voltage A, which lights the LED 315 to inform the operator of the failure of the generator whereby the failure of the A. C. generator can be readily recognized.

Industrial Applicability

According to the present invention, an electronic circuit of a control unit which is accommodated inside a vehicle-mounted A.C. generator,and adopted to control an output of the generator is formed as a monolithic IC chip on a ceramic substrate, whereby the size of the whole apparatus is reduced, and also a resistance value of a field current detecting resistor which has been formed on the ceramic substrate by utilizing the printing method is adjusted in accordance with the specifications of a field current of the A.C. generator.

What is claimed is:

1. A controller for an A.C. generator for a vehicle, comprising:

batteries each of which is charged with electric charges on the basis of an output of generation of electrical energy of an A.C. generator having a field coil;

voltage regulating means for regulating a current, which is caused to flow through said field coil, on the basis of the detection result of a voltage developed across the terminals of said batteries due to an output voltage of said A.C. generator into a fixed output value of the generation of electrical energy of said A.C. generator; and field current restricting means for detecting a current which is caused to flow through said field coil by means of a field current detecting resistor to restrict the current to a predetermined value in correspondence to the detection result, wherein said field current detecting resistor is a thick film printed resistor, and wherein each of said means other than said thick film printed resistor is an electronic circuit and the electronic circuits are configured in the form of an integrated circuit.

2. A controller for an A.C. generator for a vehicle according to claim 1, wherein said thick film printed resistor and said integrated circuits are formed on an insulating board.

3. A controller for an A.C. generator for a vehicle according to claim 1, wherein a resistor body constituting said thick film printed resistor is trimmed to adjust the resistance value thereof and to adjust the field current detection value.

4. A controller for an A.C. generator for a vehicle according to claim 1, further comprising a failure alarm means for detecting a failure of said A.C. generator to give an alarm, wherein the failure alarm means is an integrated circuit.

* * * * *